(12) United States Patent
Hashimoto et al.

(10) Patent No.: US 7,186,307 B2
(45) Date of Patent: Mar. 6, 2007

(54) METHOD FOR MANUFACTURING A CERAMIC MULTILAYER CIRCUIT BOARD

(75) Inventors: Akira Hashimoto, Kyoto (JP); Masaaki Katsumata, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/363,904

(22) PCT Filed: Jul. 11, 2002

(86) PCT No.: PCT/JP02/07075

§ 371 (c)(1),
(2), (4) Date: Oct. 7, 2003

(87) PCT Pub. No.: WO03/007670

PCT Pub. Date: Jan. 23, 2003

(65) Prior Publication Data

US 2004/0060646 A1    Apr. 1, 2004

(30) Foreign Application Priority Data

Jul. 12, 2001 (JP) ............................. 2001-211827

(51) Int. Cl.
*B32B 37/06* (2006.01)
*B44C 1/165* (2006.01)
*H05K 3/20* (2006.01)
*H05K 3/46* (2006.01)

(52) U.S. Cl. ................. 156/89.12; 156/89.16; 156/89.17; 156/232; 156/235

(58) Field of Classification Search ................ 156/230, 156/233, 235, 89.12, 89.16, 89.23
See application file for complete search history.

(56) References Cited

U.S. PATENT DOCUMENTS

| | | | | |
|---|---|---|---|---|
| 4,679,320 A | * | 7/1987 | Imanaka et al. | 29/848 |
| 4,680,154 A | * | 7/1987 | Matsubara et al. | 264/639 |
| 4,871,608 A | * | 10/1989 | Kondo et al. | 428/209 |
| 5,004,640 A | * | 4/1991 | Nakatani et al. | 428/195.1 |
| 5,201,268 A | | 4/1993 | Yamamoto et al. | |
| 5,252,519 A | * | 10/1993 | Nakatani et al. | 29/832 |

(Continued)

FOREIGN PATENT DOCUMENTS

JP           02-267157 A           10/1990

(Continued)

*Primary Examiner*—Melvin C. Mayes
(74) *Attorney, Agent, or Firm*—McDermott Will & Emery LLP

(57) ABSTRACT

By increasing the quantity of resin binder of at least one of conductive paste and ceramic green sheet, adhesion between conductive film and the ceramic green sheet is improved when an intaglio filled with the conductive paste is hot pressed on the ceramic green sheet. As a result, transfer failure at intaglio transfer is removed and internal fracture of the ceramic green sheet is suppressed. Also, by coating an adhesive layer on an intaglio filled with conductive paste, adhesion with ceramic green sheet is improved and transfer failure at intaglio transfer is suppressed.

9 Claims, 3 Drawing Sheets

U.S. PATENT DOCUMENTS

| | | | | |
|---|---|---|---|---|
| 5,256,609 A | * | 10/1993 | Dolhert | 156/89.27 |
| 5,540,884 A | * | 7/1996 | Chiao | 419/47 |
| 5,609,704 A | | 3/1997 | Hayama et al. | |
| 5,747,396 A | * | 5/1998 | Miyakoshi et al. | 501/32 |
| 5,766,528 A | * | 6/1998 | Su et al. | 264/109 |
| 5,821,181 A | * | 10/1998 | Bethke et al. | 501/8 |
| 6,132,543 A | | 10/2000 | Mohri et al. | |
| 6,319,343 B1 | * | 11/2001 | Felisberto et al. | 156/89.12 |
| 6,350,334 B1 | * | 2/2002 | Shigemi et al. | 156/89.12 |
| 6,572,955 B2 | * | 6/2003 | Terashi et al. | 428/209 |
| 2001/0010616 A1 | * | 8/2001 | Mizuno | 361/306.3 |
| 2001/0016256 A1 | * | 8/2001 | Chazono | 428/325 |
| 2002/0094604 A1 | | 7/2002 | Hayama et al. | |

FOREIGN PATENT DOCUMENTS

| | | | |
|---|---|---|---|
| JP | 2-310996 | | 12/1990 |
| JP | 3-153308 | * | 7/1991 |
| JP | 03-153308 A | | 7/1991 |
| JP | 06-164142 A | | 6/1994 |
| JP | 9-162066 | * | 6/1997 |
| JP | 09-169569 A | | 6/1997 |
| JP | 11-78202 | * | 3/1999 |
| JP | 11-121645 A | | 4/1999 |
| JP | 11-220260 | * | 8/1999 |
| JP | 11-220260 A | | 8/1999 |
| JP | 2000-183503 A | | 6/2000 |
| WO | 92/13435 | * | 8/1992 |

* cited by examiner

METHOD FOR MANUFACTURING A CERAMIC MULTILAYER CIRCUIT BOARD

TECHNICAL FIELD

The present invention relates to a method for manufacturing ceramic multilayer circuit board.

BACKGROUND ART

In recent years, ceramic multilayer circuit boards mainly employ low-temperature fired boards and are used as small components such as for personal computers and cellular phones. When manufacturing these ceramic multilayer boards, it is general practice to laminate ceramic green sheets. Screen printing method is generally employed in forming inner-layer wiring conductors while screen printing method, thin-film photolithography, or thick-film photolithography (for example, Fodel by DuPont) is employed in forming outer-layer wiring conductors.

In extremely miniaturized electronic components to be used in devices such as cellular phones, printed circuit boards have built-in inductor elements (L), capacitor elements (C) or resistor elements (R). This has enabled development of circuit boards having an L-C-R combined circuit such as a filter. As L-C-R elements and inner wiring conductors are formed by screen printing as disclosed in Japanese Patent Application Non-Examined Publication No. H02-310996, for example, there has been a need for a technology to make screen printing finer. However, in screen printing, 100 μm is the limit of wiring pitch (line width plus interwiring distance) in manufacturing.

Referring to FIG. 3A to FIG. 3E, a description will be given on conventional technology for manufacturing green sheet multilayer circuit boards. As illustrated in FIG. 3A, through holes 32 are first made on ceramic green sheet 31 by means of a punching device, stamping die, or YAG laser device. Subsequently, via hole conductors 33 are formed by screen printing conductive paste in through holes 32 as illustrated in FIG. 3B. Next, as illustrated in FIG. 3C, wiring conductors 34 are formed by screen printing conductive paste on a green sheet on which via hole conductors 33 have been formed. Furthermore, two or more green sheets on which the above-mentioned wiring conductors 34 have been formed are laminated and integrated into one piece by hot pressing as illustrated in FIG. 3D. The binder in the work is then burned-out and fired to obtain a ceramic multilayer circuit board. In the conventional method of manufacture, as the inner conductor pattern is made by screen printing, the wiring pitch has a limit of the order of 100 μm and the thickness of the conductive film after firing is of the order of 7–8 μm.

In order to make the packing density of a ceramic circuit board high, it is necessary to employ thick-film intaglio transfer process for the formation of the conductor patterns as the thick-film intaglio transfer process can form conductor patterns having fineness (wiring pitch of the order of 40 μm) and high aspect ratio (fired thickness of the order of 10 μm). If conductor patterns can be formed on a ceramic green sheet by thick-film intaglio transfer process, then it becomes possible to manufacture ceramic multilayer circuit boards by applying the technique to laminated green sheets. Such a method is disclosed in Japanese Patent Application Non-Examined Publication No. H11-121645, for example.

In order to directly transfer conductor patterns on a ceramic green sheet by thick-film intaglio transfer process, it is necessary to coat on the ceramic green sheet an adhesive layer having thermoplastic resin as the main ingredient. However, as the solution of the adhesive layer contains high volatility solvent such as toluene and acetone, ceramic green sheet dissolves in the solution. Also, even though an adhesive layer could have been formed on the surface of a ceramic green sheet, when an intaglio filled with conductive paste and the ceramic green sheet come into close contact with an adhesive interposed in between after hot pressing, the ceramic green sheet undergoes internal fracture during the process of peeling the intaglio as the ceramic green sheet is spongy.

DISCLOSURE OF INVENTION

Content of the resin binder in the conductive paste or ceramic green sheet is increased. This will enhance adhesion between a conductive film and the ceramic green sheet when the conductive paste is filled in an intaglio and hot pressed on the ceramic green sheet, thereby removing transfer failure at intaglio transfer and at the same time suppressing internal fracture of the ceramic green sheet.

Also, an adhesive layer is coated on the intaglio filled with conductive paste. This will enhance adhesion with the ceramic green sheet thus suppressing transfer failure after intaglio transfer.

BEST MODE FOR CARRYING OUT THE INVENTION

First Exemplary Embodiment

FIGS. 1A to 1E illustrate a method for manufacturing a ceramic circuit board by forming conductor patterns on a ceramic green sheet by thick-film intaglio transfer process.

Figure 1A:
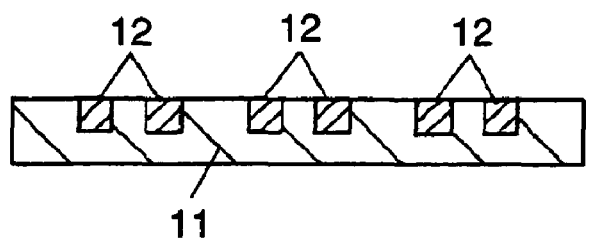
FIG. 1A is a cross-sectional view to illustrate filling of conductive paste in an intaglio in the first exemplary embodiment of the present invention.

In FIG. 1A, conductive paste 12 is filled with a ceramic blade or the like in intaglio 11 having grooves made by excimer laser, and dried. As the film for making the intaglio, heat resistant material such as polyimide or aramid is used after surface treatment in advance such as coating a mold-releasing agent for easy peeling while transferring.

Also, as conductive paste 12, silver-based paste is used which can be fired at 850° C. to 900° C. Intaglio 11 filled with conductive paste 12 is dried for 5 to 10 minutes at 100° C. to 150° C. After drying, the volume of conductive paste 12 filled in the grooves of intaglio 11 reduces due to evaporation of the solvent in the paste. Therefore, filling and drying of conductive paste 12 is repeated until recess of the dried surface of conductive paste 12 filled in the grooves of intaglio 11 relative to the non-grooved surface becomes equal to 5 μm or smaller.

Figure 1B:
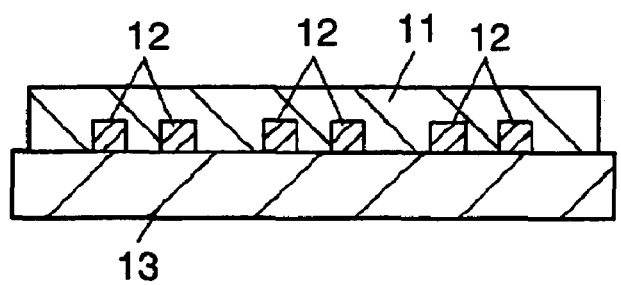
FIG. 1B is a cross-sectional view to illustrate transfer of the conductive paste by hot pressing.

Next, by using intaglio 11 filled with the above-mentioned conductive paste 12 on ceramic green sheet 13, conductive paste 12 is transferred onto ceramic green sheet 13 as illustrated in FIG. 1B. In this hot pressing process, the temperature is set at or above the softening temperature of the ceramic green sheet material and at no higher than 100° C. at the maximum. The pressing pressure is about 50 to 80 kg/cm$^2$ and the pressing time is about 3 to 10 minutes. These conditions may be adjusted depending on the state of transfer of the conductor pattern.

Figure 1C:
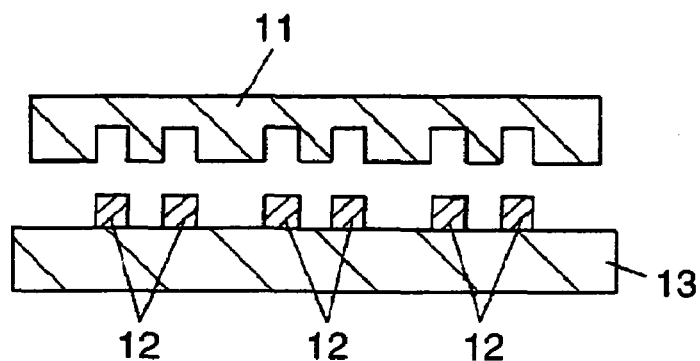
FIG. 1C is a cross-sectional view to illustrate the state of conductive paste after being transferred on a ceramic green sheet by peeling the intaglio.

Subsequently, as illustrated in FIG. 1C, by peeling off intaglio 11 from ceramic green sheet 13 after conductive paste 12 has been transferred, a very fine pattern of conductive paste 12 is obtained on ceramic green sheet 13.

Figure 1D:
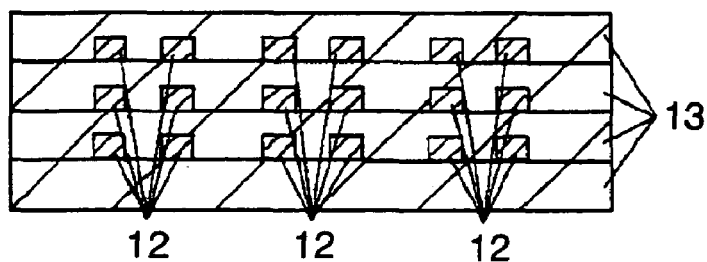
FIG. 1D is a cross-sectional view to illustrate the state after samples of FIG. 1C are laminated and integrated into one piece by hot pressing.

Furthermore, as illustrated in FIG. 1D, a desired number of ceramic green sheets 13 on which conductor patterns have been formed through the steps of FIGS. 1A to 1C are laminated, and integrated into one piece by hot pressing the laminate. In this hot pressing operation, the temperature must be equal to or higher than the softening temperature of ceramic green sheets 13 and lower than the temperature at which abrupt volatilization of plasticizer and solvent in ceramic green sheets 13 might take place, namely, 100° C. or lower. Also, the hot pressing pressure is about 100 to 150 kg/cm$^2$ and the pressing time is about 3 to 10 minutes.

Figure 1E:
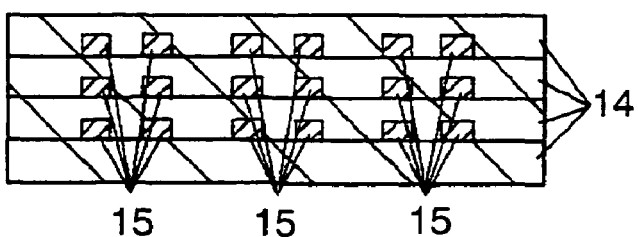
FIG. 1E is a cross-sectional view to illustrate the state after burning out the binder and firing of the work of FIG. 1D.

By burning out the binder in ceramic green sheets 13 and firing it, a ceramic circuit board that has high packing density conductive films 15 formed within sintered ceramic sheets 14 as illustrated in FIG. 1E is fabricated. As an example, when MLS-1000 material of Nippon Electric Glass Co., Ltd. is used as ceramic green sheet 13, the temperature for reducing the binder by firing is chosen to be 400° to 500° C. while the firing temperature is chosen to be about 900° C. in order that as little residual carbon as possible will remain.

By employing thick-film intaglio transfer process as described above, high packing density conductor patterns can be easily formed on ceramic green sheets.

Next, a description will be given on the composition of the material for conductive paste 12. Conductive paste 12 consists of noble metal powder, inorganic additive, organic binder, organic solvent, and plasticizer. The noble metal powder contains 60% to 70% by weight of Ag powder or mixed powder of Ag powder and Pd powder and the like. The inorganic additive contains bismuth oxide (or organic compound of bismuth), copper oxide (or organic compound of copper), silicon oxide (or organic compound of silicon), or lead oxide (or organic compound of lead), where the metal content is 5% to 8% by weight. Also, the organic binder contains 5% to 20% by weight of ethyl cellulose resin, butyral resin or acrylic resin and the like. The remainder is organic solvent and plasticizer.

The organic binder content of conductor paste is generally in the range 3% by weight to less than 5% by weight. However, with this binder content, when thick-film intaglio transfer is carried out, adherence between conductive paste 12 filled in intaglio 11 and ceramic green sheet 13 is poor, sometimes causing some of conductive paste 12 to remain on the side of the intaglio without being transferred. Accordingly, by increasing the organic binder content of conductive paste 12 to 5% by weight or greater, the adherence between conductive paste 12 and ceramic green sheet 13 is improved. Especially when the organic binder content of conductive paste 12 is made to 10% by weight or greater, the adherence between conductive paste 12 filled in the intaglio and ceramic green sheet 13 is improved enabling perfect transfer.

Also, when the organic binder content of conductive paste 12 exceeds 20% by weight, the adherence between conductive paste 12 and ceramic green sheet 13 is sufficient thus enabling perfect transfer. However, conductive film 15 becomes porous making the conductor resistance higher. As a result, by making the organic binder content of conductive paste 12 equal to 5% by weight or greater and equal to or less than 20% by weight, preferably 10% by weight or greater and at most 20% by weight, thick-film intaglio transfer can be perfectly carried out while at the same time good conductive film 15 can be obtained.

Next, a description will be given on the material composition of ceramic green sheet 13. Ceramic green sheet 13 consists of alumina powder, glass powder, organic binder, and plasticizer. The content of alumina powder is 20% to 35% by weight and the content of glass powder is 25% to 40% by weight. The organic binder contains 12% to 25% by weight of butyral resin or mixture of ethyl cellulose resin and butyral resin, or acrylic resin. The plasticizer contains 5% to 10% by weight of fatty ester or glycol derivative. This composition of ceramic green sheet 13 is based on the state after being formed into sheets.

The organic binder content of ceramic green sheets is generally 8% by weight or greater and less than 12% by weight. With this binder content, however, when thick-film intaglio transfer is carried out, the adherence between conductive paste 12 filled in intaglio 11 and ceramic green sheet 13 is poor sometimes causing some of conductive paste 12 to remain on the side of intaglio 11 without being transferred. Therefore, by increasing the organic binder content of ceramic green sheet 13 to 12% by weight or greater, the adherence between conductive paste 12 and ceramic green sheet 13 is improved. Especially when the organic binder content of ceramic green sheet 13 is 15% by weight or greater, when the above-mentioned thick-film intaglio transfer is carried out, the adherence between conductive paste 12 filled in the intaglio and ceramic green sheet 13 is improved enabling perfect transfer.

Also, when the organic binder content of ceramic green sheet 13 exceeds 25% by weight, the adherence between conductive paste 12 and ceramic green sheet 13 is sufficient when above-mentioned thick-film intaglio transfer is carried out enabling perfect transfer. However, ceramic green sheet 14 after sintering becomes porous thus deteriorating in denseness. As a result, by making the organic binder content of ceramic green sheet 13 in the range 12% by weight to 25% by weight, preferably in the range 15% by weight to 25% by weight, thick-film intaglio transfer can be perfectly carried out while at the same time good conductive film 15 is obtained.

Next, a description on the content of the organic binder of ceramic green sheet 13 will be given. The organic binder normally contains butyral-based resin. However, when such organic binder is used, in the process of burning out the binder and firing as shown in FIG. 1E, the following condition for burning has be to observed in order to make residual carbon content of the sintered ceramic after firing to be no more than 100 ppm:

| | |
|---|---|
| Rate of temperature rise: | 85°–140° C./hour |
| Peak temperature: | 400°–500° C. |
| Time of peak temperature: | 3–5 hours |

These conditions apply to a laminate similar to that shown in FIG. 1D with 8 layers of ceramic green sheets 13 each being 100 μm thick.

When acrylic resin (such as butyl acrylate or butyl methacrylate) is used as the organic binder component for ceramic green sheet 13, the condition for burning out the binder and firing is as below:

| | |
|---|---|
| Rate of temperature rise: | 85°–140° C./hour |
| Peak temperature: | 400°–500° C. |
| Time of peak temperature: | 1 hour |

When acrylic resin is used as the organic binder component of ceramic green sheet 13 as above, the time of the process for reducing the binder by firing can be shortened.

It is preferable to use acrylic resin as the organic binder component for conductive paste 12, too.

Next, a description will be given on the composition of the plasticizer for ceramic green sheet 13. As mentioned above, ceramic green sheets 13 that are generally used for green sheet multilayer process contain, as the plasticizer, fatty ester such as phthalic ester, phosphoric ester, or glycol derivative (typically dibutyl phthalate) in the amount equal to or greater than 2% by weight to less than 5% by weight. However, when using green sheets with this amount of added plasticizer, the adherence between conductive paste 12 and ceramic green sheet 13 during thick-film intaglio transfer process under heat and pressure of FIG. 1B is not sufficient thus sometimes causing transfer failure.

Therefore, by making the plasticizer content of ceramic green sheet 13 equal to or greater than 5% by weight, the adherence between conductive paste 12 and ceramic green sheet 13 is improved. Especially when the content is 6% by weight or greater, the above-mentioned transfer failure will not occur. Here, when the plasticizer content of ceramic green sheet 13 exceeds 10% by weight, ceramic green sheet 13 softens. This will result in large elongation of ceramic green sheet 13 in the direction of the plane during the hot pressing operation (rate of elongation being 0.5% or greater).

Consequently, when manufacturing a ceramic circuit board having high-density conductor patterns, it is desirable to make the plasticizer content of ceramic green sheet 13 equal to or greater than 5% by weight and at most 10% by weight, preferably in the range from 6% by weight to 10% by weight.

Second Exemplary Embodiment

FIGS. 2A to 2F illustrate other method for manufacturing ceramic circuit board in which a conductor pattern is formed on a ceramic green sheet by thick-film intaglio transfer process. Elements similar to those in the first exemplary embodiment have the same reference numerals.

Figure 2A:
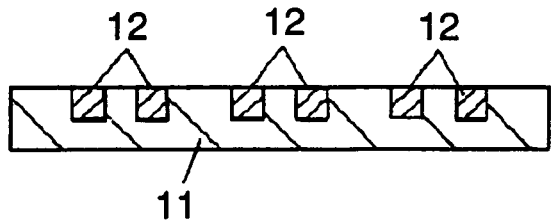
FIG. 2A is a cross-sectional view to illustrate the step of filling conductive paste in an intaglio in the second exemplary embodiment of the present invention.

FIG. 2A illustrates the process of filling conductive paste 12 in intaglio 11. Details are similar to those in FIG. 1A in the first exemplary embodiment.

Figure 2B:
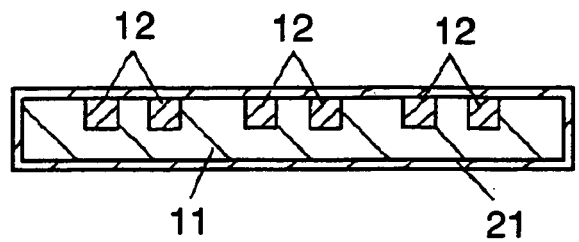
FIG. 2B is a cross-sectional view to illustrate the state after an adhesive layer has been formed on the surface of the intaglio of FIG. 2A.

Next is the process of forming a uniform adhesive layer 21 with an adhesive agent solution on intaglio film 11 filled with conductive paste 12 by dipping or using roll coater as illustrated in FIG. 2B. The adhesive agent solution is prepared by dissolving thermoplastic resins such as butyral resin and acrylic resin into an organic solvent such as toluene, acetone, ethyl acetate, and methyl ethyl ketone.

Figure 2C:
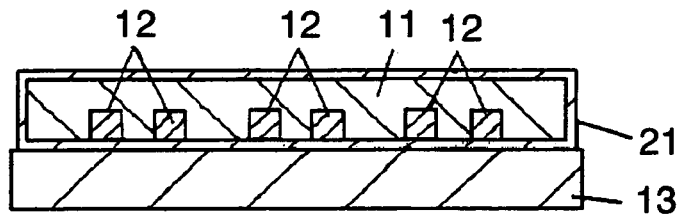
FIG. 2C is a cross-sectional view to illustrate transfer of conductive paste by hot pressing.

Subsequently, as illustrated in FIG. 2C, a conductor pattern is formed on ceramic green sheet 13 by temporarily transferring conductive paste by hot pressing through thick-film intaglio transfer process using intaglio 11 on which adhesive layer 21 has been formed. The hot pressing condition is the same as for FIG. 1B in the first exemplary embodiment.

Figure 2D:
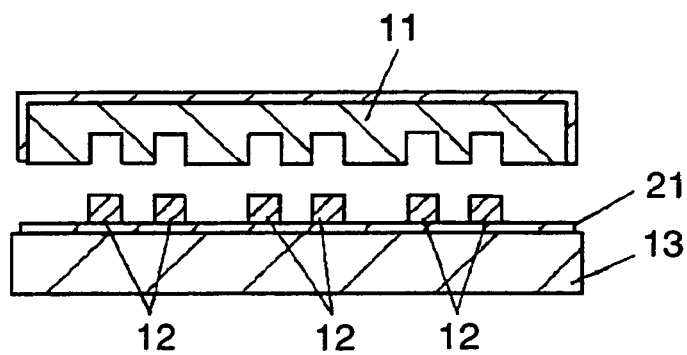
FIG. 2D is a cross-sectional view to illustrate the state of conductive paste being transferred on a ceramic green sheet by peeling the intaglio.
Figure 2E:
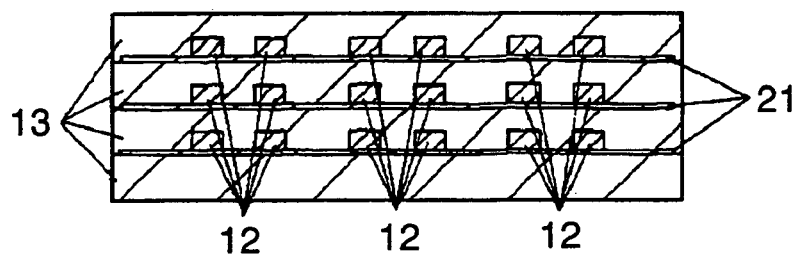
FIG. 2E is a cross-sectional view to illustrate the state after samples of FIG. 2D are laminated and integrated into one piece by hot pressing.

By subsequently peeling intaglio 11 from ceramic green sheet 13, a very fine conductor pattern adhering on top of ceramic green sheet 13 through hot pressing is obtained as illustrated in FIG. 2D.

A desired number of ceramic green sheets 13 on which conductor pattern has been formed in the way illustrated in FIGS. 2A to 2D are laminated, and hot pressed into one piece. The hot pressing condition is the same as for FIG. 1D in the first exemplary embodiment.

Figure 2F:
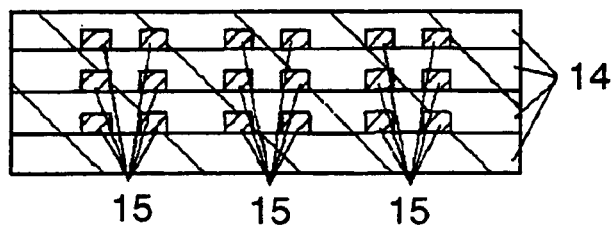
FIG. 2F is a cross-sectional view to illustrate the state after burning out the binder and firing of the work of FIG. 2E.
Figure 3A:
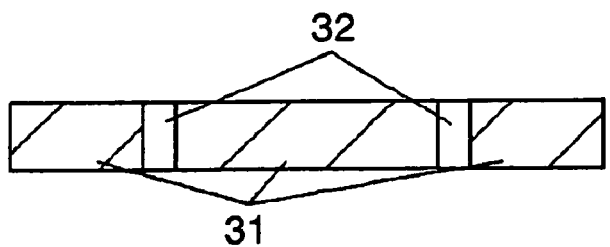
FIG. 3A is a cross-sectional view to illustrate the state after through holes have been made on a ceramic green sheet in a conventional process.
Figure 3B:
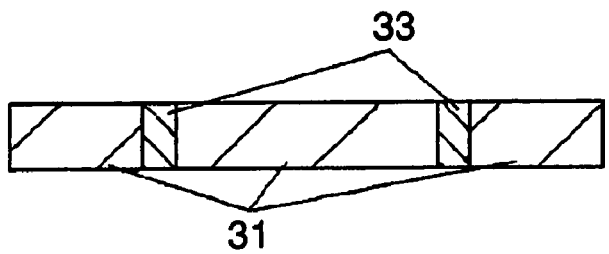
FIG. 3B is a cross-sectional view to illustrate the state after via hole conductors have been filled in the through holes of FIG. 3A.
Figure 3C:
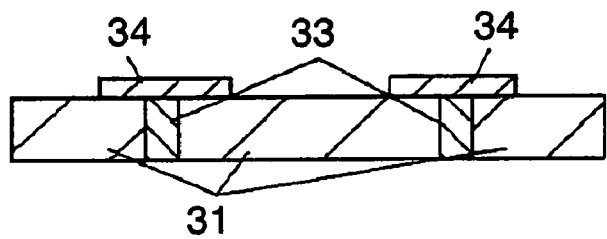
FIG. 3C is a cross-sectional view to illustrate the state after wiring conductors have been provided on the ceramic green sheet of FIG. 3B.
Figure 3D:
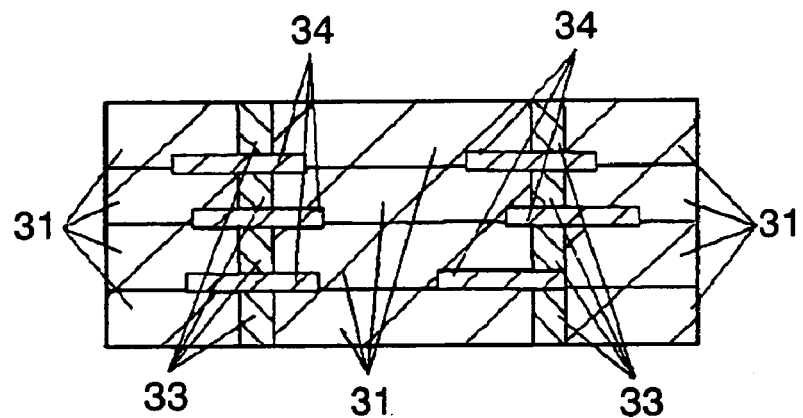
FIG. 3D is a cross-sectional view to illustrate the state after samples of FIG. 3C are laminated and integrated into one piece by hot pressing.
Figure 3E:
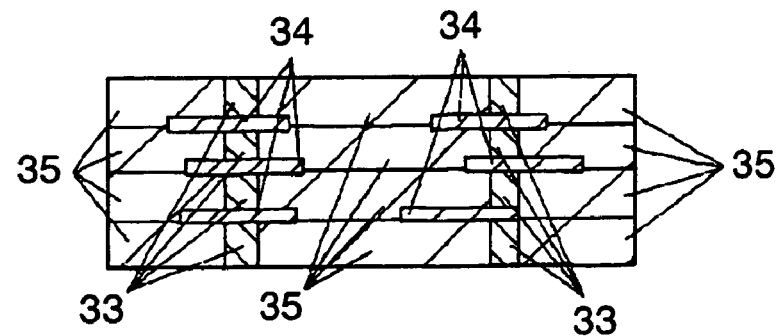
FIG. 3E is a cross-sectional view to illustrate the state after burning out the binder and firing of the work of FIG. 3D.

By burning out the binder in the green sheet and firing it, a ceramic circuit board having high density conductor patterns as illustrated in FIG. 2F can be fabricated.

INDUSTRIAL APPLICABILITY

In the thick-film intaglio transfer process in accordance with the present invention, the content of resin binder in the conductive paste or ceramic green sheet material before sintering is high. The process also includes a step of coating an adhesive layer on an intaglio filled with conductive paste. These measures improve adhesion between the conductive paste and ceramic green sheet thereby enabling easy manufacture of ceramic multilayer circuit board having a high-density conductor pattern.

The invention claimed is:

1. A method for manufacturing a ceramic multilayer circuit board comprising the steps of:
   a. filling conductive paste in an intaglio to form a conductor pattern;

b. transferring said conductor pattern directly onto the surface of a ceramic green sheet;
c. forming a desired number of layers by repeating steps a and b;
d. laminating said layers into a multilayer structure;
e. hot pressing said multilayer structure into an integrated laminated structure; and
f. firing said integrated laminated structure,
   wherein content of a plasticizer in said ceramic green sheet is at least 6% and at most 10% by weight,
   wherein said step b of transferring said conductor pattern onto the surface of the ceramic green sheet includes hot-pressing the intaglio to the ceramic green sheet,
   wherein content of an organic binder in said ceramic green sheet is at least 15% and at most 25% by weight, and
   wherein content of an organic binder in said conductive paste is at least 5% and at most 25% by weight.

2. The method for manufacturing a ceramic multilayer circuit board of claim 1, wherein content of an organic binder in said conductive paste is at least 10% and at most 20% by weight.

3. The method for manufacturing a ceramic multilayer circuit board of claim 1, wherein said ceramic green sheet contains an acrylic resin binder.

4. The method for manufacturing a ceramic multilayer circuit board of claim 1, wherein said conductive paste contains an acrylic resin binder.

5. The method for manufacturing a ceramic multilayer circuit board of claim 1, wherein step f comprises a first firing step at a first firing temperature for burning out binder in said ceramic green sheet and a second firing step at a second firing temperature higher than the first firing temperature.

6. The method for manufacturing a ceramic multilayer circuit board of claim 5, wherein the first firing temperature is in the range of 400° C. to 500° C., inclusive.

7. The method for manufacturing a ceramic multilayer circuit board of claim 5, wherein the second firing temperature is about 900° C.

8. The method for manufacturing a ceramic multilayer circuit board of claim 5, wherein the first firing temperature is in the range of 400° C. to 500° C., inclusive, and the second firing temperature is about 900° C.

9. The method for manufacturing a ceramic multilayer circuit board of claim 1, wherein step b comprises hot pressing said intaglio and said ceramic green sheet, and peeling off said intaglio.

* * * * *